(12) United States Patent
Wu et al.

(10) Patent No.: US 12,543,258 B2
(45) Date of Patent: Feb. 3, 2026

(54) HEAT SINK, HEAT DISSIPATION UNIT, AND SERVER

(71) Applicant: SHENZHEN MICROBT ELECTRONICS TECHNOLOGY CO., LTD., Guangdong (CN)

(72) Inventors: Yuefeng Wu, Guangdong (CN); Haifeng Guo, Guangdong (CN); Shilei Yuan, Guangdong (CN); Fangyu Liu, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 309 days.

(21) Appl. No.: 18/274,172

(22) PCT Filed: Mar. 6, 2023

(86) PCT No.: PCT/CN2023/079827
§ 371 (c)(1),
(2) Date: Jul. 25, 2023

(87) PCT Pub. No.: WO2024/007605
PCT Pub. Date: Jan. 11, 2024

(65) Prior Publication Data
US 2025/0089151 A1 Mar. 13, 2025

(30) Foreign Application Priority Data
Jul. 4, 2022 (CN) .......................... 202210781290.2

(51) Int. Cl.
*H05K 1/02* (2006.01)
(52) U.S. Cl.
CPC ................................ *H05K 1/0203* (2013.01)

(58) Field of Classification Search
CPC ....... H05K 1/0203–0212; H05K 1/141; H05K 1/181; H05K 1/293; H05K 7/2039;
(Continued)

(56) References Cited

U.S. PATENT DOCUMENTS 7,891,845 B2 * 2/2011 Zhang ..................... F21V 29/76
362/218
8,066,404 B2 * 11/2011 Song ...................... F21V 29/71
362/396
(Continued)

FOREIGN PATENT DOCUMENTS

CN 201845759 U 5/2011
CN 108550559 A 9/2018
(Continued)

OTHER PUBLICATIONS

CN-215266269-U English Translation (Year: 2021).*
(Continued)

*Primary Examiner* — Amir A Jalali
(74) *Attorney, Agent, or Firm* — Merchant & Gould P.C.

(57) ABSTRACT

Embodiments of this application disclose a heat sink, a heat dissipation unit, and a server. A first surface of the heat sink is provided with a heat dissipation fin, and a second surface of the heat sink is configured to dock with a circuit board. A heating element, such as a chip, is arranged on the circuit board. A die of the chip is located on a surface of the chip away from the circuit board, that is, the chip is packaged into a flipchip or packaged into a flipchip with an exposed die. At a position corresponding to the die, the second surface of the heat sink is provided with a protection groove, with a cross-sectional area of the protection groove being at least greater than an area of the die.

15 Claims, 7 Drawing Sheets

(58) Field of Classification Search
CPC .......... H05K 7/20409; H05K 7/20436; H05K 7/20445; H05K 7/205; H05K 7/20854; H05K 2201/066; H05K 2201/10409; H05K 2201/10424; H05K 2201/10598; H01L 23/293; H01L 23/3107; H01L 23/3157; H01L 23/3672; H01L 23/367; H01L 23/373; H01L 23/3735; H01L 23/3736; H01L 23/473; H01L 25/0655; H01L 21/4871; H01L 21/4882; H01L 21/56; H01L 2023/4042
See application file for complete search history.

(56) References Cited

U.S. PATENT DOCUMENTS

| | | | | |
|---|---|---|---|---|
| 2002/0109226 | A1* | 8/2002 | Khan | H01L 23/50 257/E23.079 |
| 2006/0091509 | A1* | 5/2006 | Zhao | H01L 23/552 257/E23.101 |
| 2010/0019379 | A1* | 1/2010 | Zhao | H01L 23/3675 257/E21.705 |
| 2017/0257977 | A1* | 9/2017 | Chainer | H01L 23/367 |
| 2020/0404803 | A1* | 12/2020 | Uchida | H05K 1/0204 |
| 2021/0321527 | A1* | 10/2021 | Ma | H02M 3/003 |
| 2023/0207422 | A1* | 6/2023 | Refai-Ahmed | H01L 23/427 257/704 |
| 2023/0328937 | A1* | 10/2023 | An | H05K 7/20145 361/695 |
| 2024/0121881 | A1* | 4/2024 | Chen | H05K 1/0203 |
| 2024/0324093 | A1* | 9/2024 | Zhuang | H05K 9/0032 |

FOREIGN PATENT DOCUMENTS

| | | | |
|---|---|---|---|
| CN | 215266269 | U | * 12/2021 |
| CN | 217239446 | U | 8/2022 |
| CN | 217740516 | U | 11/2022 |

OTHER PUBLICATIONS

International Search Report and Written Opinion for PCT/CN2023/079827 dated Jun. 13, 2023 (22 pages including English Translation).

* cited by examiner

HEAT SINK, HEAT DISSIPATION UNIT, AND SERVER

CROSS-REFERENCE TO RELATED APPLICATIONS

This application is a National Stage Application of International Application No. PCT/CN2023/079827, filed 6 Mar. 2023, which claims the benefit of Serial No. 202210781290.2, filed 4 Jul. 2022 in China, and which applications are incorporated herein by reference. To the extent appropriate, a claim of priority is made to each of the above disclosed applications.

TECHNICAL FIELD

The present invention relates to a field of heat sink technologies, and in particular, to a heat sink, a heat dissipation unit, and a server.

BACKGROUND

At present, in order to dissipate heat from a heating element (such as a chip) on a circuit board, heat sinks are usually installed on one or two surfaces of the circuit board.

A heat sink is usually fixed on a surface of the circuit board by screws to contact and attach to a surface of a chip, so as to dissipate heat from the heating element such as the chip, and the surface of the heat sink for attaching the chip is usually a plane. In addition, in order to improve heat dissipation efficiency, the chip on the circuit board is packaged into a flipchip, that is, a die of the chip is arranged on an upper part (namely, an end away from the circuit board), and sometimes the die is even exposed relative to a surrounding plastic seal (which is a flipchip package with an exposed die).

SUMMARY

Embodiments of this application provide a heat sink, a heat dissipation unit, and a server. In these embodiments, a protection groove is arranged on a surface of the heat sink that is for attaching a heating element, and the protection groove may at least accommodate a die on the heating element, so that the die on a chip on a circuit board that is packaged into a flipchip, especially packaged into a flipchip with an exposed die and the like, may be well protected, thereby greatly reducing reliability risks.

Embodiments of this application provide a heat sink, the heat sink being configured to dissipate heat from a circuit board on which a heating element is arranged, where the heating element includes a die that is located at an end of the heating element away from the circuit board.

The heat sink includes: a heat sink body, comprising a first surface and a second surface opposite to each other, the first surface being provided with a heat dissipation fin, and the second surface being configured to dock with the circuit board, where the second surface is configured to be attached to a surface of the circuit board on which the heating element is arranged, the second surface is provided with a protection groove at a position corresponding to the die, and a cross-sectional area of the protection groove is at least greater than an area of the die.

Embodiments of this application further provide a heat dissipation unit, comprising a pair of heat sinks that are respectively arranged on two sides of a circuit board, where at least one of the pair of heat sinks is the heat sink described above.

Embodiments of this application further provide a server comprising a circuit board and a heat sink for dissipating heat from the circuit board, where the heat sink is the heat sink described above.

One or more technical solutions provided in the embodiments of this application have at least the following technical effects or advantages: the embodiments of this application provide a heat sink, a heat dissipation unit, and a server; a first surface of the heat sink is provided with a heat dissipation fin, and a second surface of the heat sink is configured to dock with a circuit board; a heating element (such as a chip) is arranged on the circuit board, and a die of the chip is located on a surface of the chip away from the circuit board, that is, the chip is packaged into a flipchip or packaged into a flipchip with an exposed die; the second surface of the heat sink is provided with a protection groove at a position corresponding to the die, and a cross-sectional area of the protection groove is at least greater than an area of the die; that is, the protection groove may at least cover or accommodate the die at the upper end of the chip; as such, when the heat sink is attached to the circuit board, the protection groove may provide a buffer space between the heat sink and the die, thereby preventing the heat sink from damaging the die, and greatly reducing reliability risks.

BRIEF DESCRIPTION OF THE DRAWINGS

To describe technical solutions in the embodiments of the present invention more clearly, the following description briefly describes the accompanying drawings required for describing the embodiments. Apparently, the accompanying drawings in the following description show merely some of the embodiments of the present invention, and a person of ordinary skill in the art may still derive other drawings from these accompanying drawings without paying inventive efforts.

Reference numerals are as follows:

- 10—circuit board, 11—heating element, 12—heating element column,
- 111—die, 112—plastic seal, 113—bump,
- 20—heat sink body, 21—heat dissipation fin, 22—heat dissipation boss, 23—protection groove, 24—mounting hole, 25—overhead space,
- 231—first protection groove,
- 232—second protection groove, and
- X—first direction.

DETAILED DESCRIPTION

To make the foregoing technical solutions better understood, the following description describes exemplary embodiments of this application in detail with reference to the accompanying drawings. Apparently, the described embodiments are merely some but not all of the embodiments of this application. It should be understood that this application is not limited to the exemplary embodiments described herein.

In order to dissipate heat from a heating element (such as a chip) on a circuit board, heat sinks are usually installed on one or two sides of the circuit board.

Figure 1:
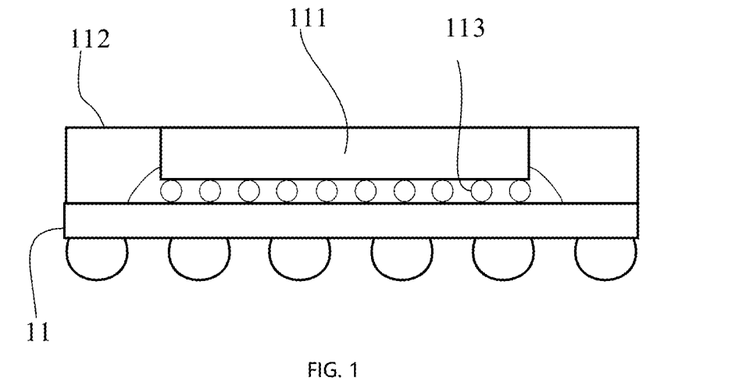
FIG. 1 is a schematic structural diagram of a chip packaged into a flipchip according to an embodiment of this application.
Figure 2:
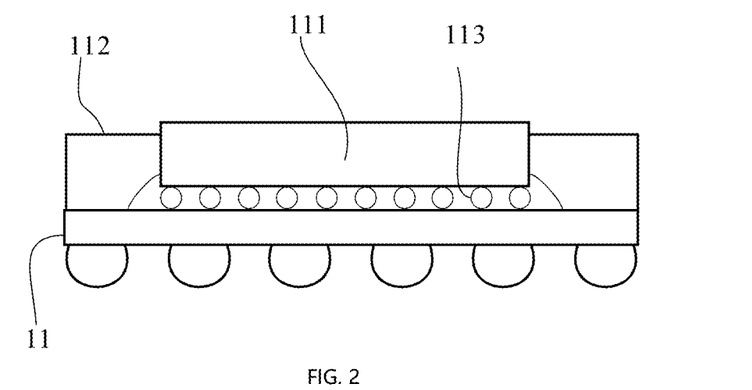
FIG. 2 is another schematic structural diagram of a chip packaged into a flipchip according to an embodiment of this application.
Figure 3:
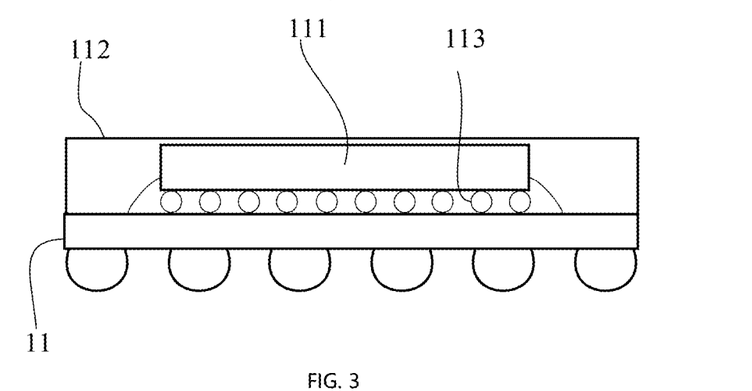
FIG. 3 is still another schematic structural diagram of a chip packaged into a flipchip according to an embodiment of this application.

In some solutions, due to high power, a chip is often packaged into a flipchip, referring to FIG. 1 to FIG. 3. That is, a die 111 on the chip is located at an upper end (namely, an end that is farther away from the circuit board) and is closer to a surface of a heat sink. In addition, as the power per chip continues to increase, heat dissipation becomes an urgent demand for the package. In order to meet this demand, a process of flipchip package with an exposed die came into being, with a heat sink additionally installed on a surface of the chip to solve the heat dissipation problem.

However, in this scenario, because the fragile die is either exposed from a surrounding plastic seal, or is relatively close to a surface of the heat sink, it is possible for the heat sink to crack the die, or damage a micro-nano structure (such as a bump) under the die. In addition, errors may exist in flatness of the surface of the heat sink, which may also cause the heat sink to crack the die, thereby bringing reliability risks.

Currently, a structure of a chip packaged into a flipchip with an exposed die that is commercially available may be illustrated referring to FIG. 1 and FIG. 2. Since the die (die 111) is flush with a plastic seal 112, or even slightly higher than the plastic seal, the die may not be protected by the plastic seal. The ordinary heat sink is pressed on the die through a heat-conductive medium, and the die is brittle. If the pressure is too large, the die is possibly cracked, or the bump (bump 113) in the die is damaged, which brings reliability risks. Especially in a scenario in which a hash board has a plurality of operational chips arranged in an M*N matrix and uses an integral heat sink, the integral heat sink needs to be fixed on the hash board by screws because the heat sink is heavy. When the heat sink is being installed, controlling a torque force of the screws is particularly important, as the heat sink may crack the chip if the torque force is slightly overexerted. In addition, during long-term operations, the heat sink is prone to thermal expansion and contraction, and the heat-conductive medium may experience performance degradation, loss and the like. In these cases, the die may be subject to a mechanical stress of the heat sink, and reliability risks of the product will be greatly increased.

For the heat dissipation of the chip that is packaged into a flipchip, or, especially for the heat dissipation of the chip that is packaged into a flipchip with an exposed die, the embodiments of this application provide a heat sink, a heat dissipation unit, and a server, where a surface of the heat sink for attaching to the chip is provided with a protection groove, and the protection groove may at least cover or accommodate the die on the heating element; as such, for the chip packaged into a flipchip, especially one that is packaged into a flipchip with an exposed die and the like, the die on the chip may be well protected, which greatly reduces the reliability risks.

Figure 4:
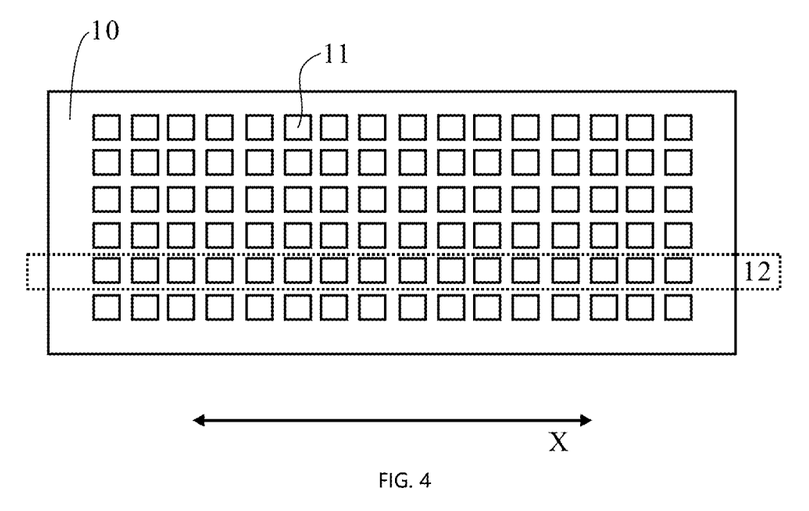
FIG. 4 is a schematic structural diagram of heating elements arranged in an array of horizontal and vertical columns on a circuit board according to an embodiment of this application.
Figure 5:
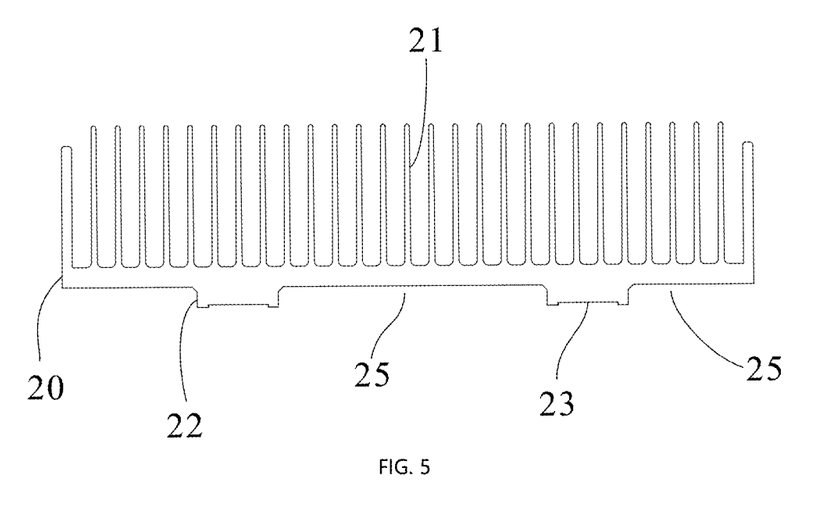
FIG. 5 is a schematic structural diagram in which a second surface of a heat sink body is provided with a protection groove according to an embodiment of this application.

Referring to FIG. 4 and FIG. 5, a heat sink is configured to dissipate heat from a circuit board 10, where a heating element 11 is arranged on the circuit board 10, the heating element 11 includes a die 111, which is located at an end of the heating element 11 away from the circuit board 10. The heat sink includes a heat sink body 20 that has a first surface and a second surface opposite to each other, the first surface is provided with a heat dissipation fin 21, and the second surface is configured to dock with the circuit board 10, where the second surface is configured to be attached to a surface of the circuit board 10 on which the heating element 11 is arranged. The second surface is provided with a protection groove 23 at a position corresponding to the die 111, and a cross-sectional area of the protection groove 23 is at least greater than an area of the die 111.

The heat sink provided in this embodiment is especially suitable for dissipating heat from such a circuit board as referring to FIG. 4, that is, the circuit board 10 has the heating element 11 arranged thereon, and the heating element 11 is, for example, a chip. Then referring to FIG. 1 to FIG. 3, the chip on the circuit board is packaged into a flipchip, or even packaged into a flipchip with an exposed die, that is, the die 111 of the chip is located at an end away from the circuit board 10 and close to the heat sink.

Referring to FIG. 5, the first surface of the heat sink is provided with the heat dissipation fin to enlarge a heat dissipation area; and the second surface of the heat sink is configured to dock with a surface of the circuit board on which the heating element is arranged. At a position corresponding to the die, the second surface of the heat sink is provided with the protection groove 23, of which a cross-sectional area is at least greater than the area of the die 111. In other words, an edge of the protection groove is at least located on the plastic seal around the die.

It may be understood that, with this arrangement, when the heat sink and the circuit board are being installed in a docking manner, at least the die on the chip may be accommodated in the protection groove, and a buffer space may be formed between the die and the heat sink (for example, the buffer space may be filled with a heat-conductive medium), thereby preventing the heat sink from damaging the die. In addition, as mentioned above, with long-term operations, the heat sink is prone to thermal expansion and contraction, but a protection cavity provided by the protection groove may allow tolerance caused by the thermal expansion and contraction of the heat sink.

With regard to the chip packaged into a flipchip with an exposed die, referring to FIG. 1 and FIG. 2, it may be understood that the die may be flush with the surrounding plastic seal, or may be slightly higher than the surrounding plastic seal.

In addition, it may be understood that, in order to improve heat dissipation efficiency, the protection groove may be filled with a heat-conductive material, such as heat-conductive silicone grease, heat-conductive gel, or heat-conductive mud. That is, the heat-conductive material is filled between the surface of the die and the surface of the heat sink.

In this embodiment, since a size or a thickness of the die are usually small, a depth of the protection groove may be on an order of microns. In addition, the depth of the protection groove may depend on a minimum size of the heat-conductive material. For example, the depth of the protection groove corresponds to the minimum size of the heat-conductive material. That is, within a range allowed by the heat-conductive material, a smaller depth of the protection groove is better.

Figure 6:
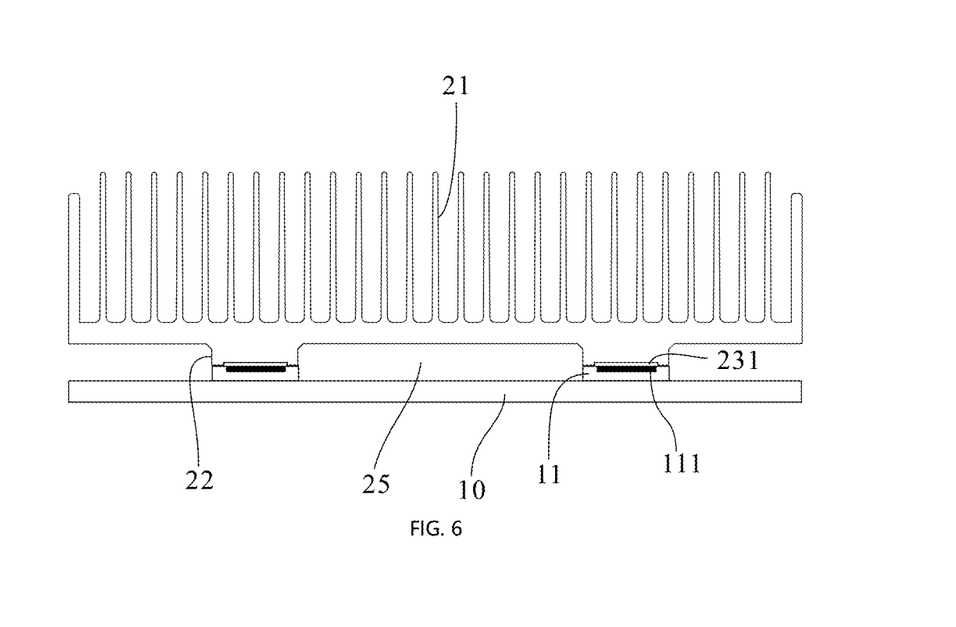
FIG. 6 is a schematic structural diagram of a first protection groove according to an embodiment of this application.
Figure 7:
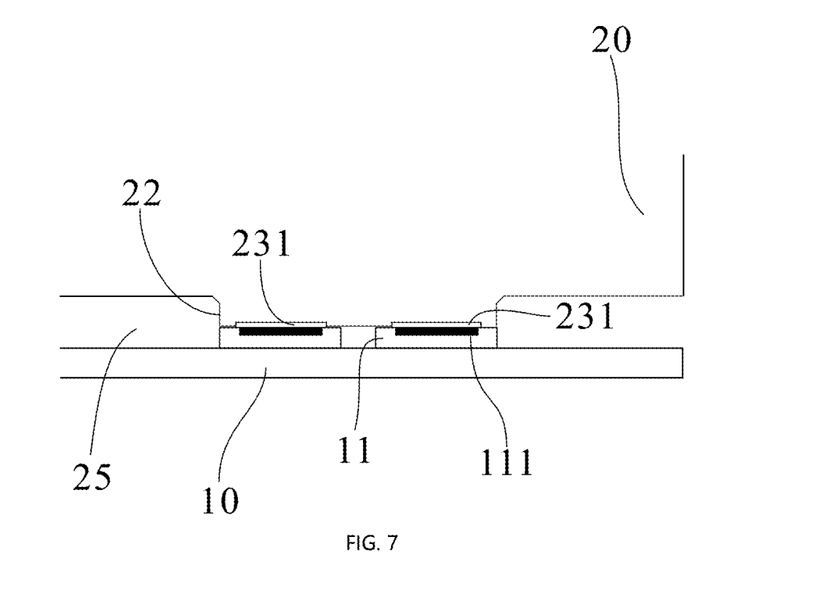
FIG. 7 is a schematic structural diagram of a first protection groove according to an embodiment of this application.

With regard to the cross-sectional area of the protection groove 23 that is at least greater than the area of the die 111, in a possible implementation referring to FIG. 6 and FIG. 7, the protection groove 23 includes a first protection groove 231, of which a cross-sectional area is between an area of the heating element 11 and an area of the die 111. That is, the first protection groove may only accommodate the die on the surface of the chip. In this case, an edge of the first protection groove will be located on the chip, that is, on the plastic seal around the die, so that the heat sink is supported by the plastic seal around the die. In this case, the depth of the first protection groove may range from 50 microns to 100 microns.

Figure 8:
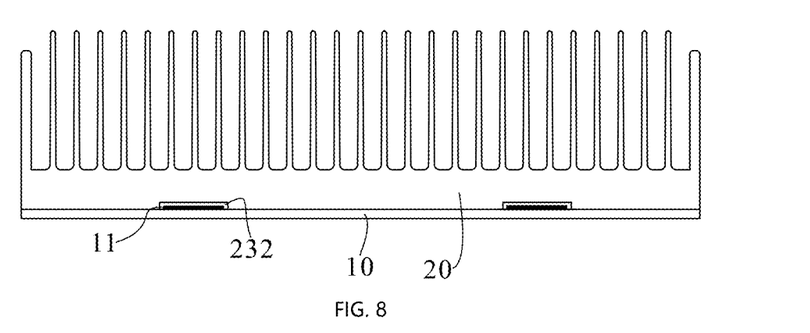
FIG. 8 is a schematic structural diagram of a second protection groove according to an embodiment of this application.
Figure 9:
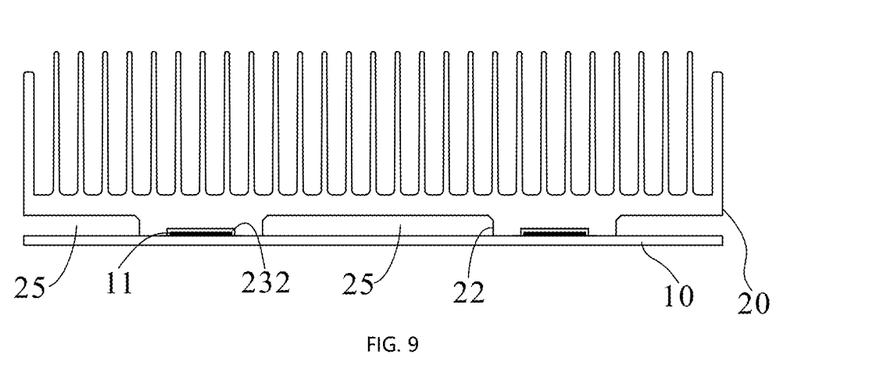
FIG. 9 is a schematic structural diagram of a second protection groove according to an embodiment of this application.

With regard to the cross-sectional area of the protection groove 23 that is at least greater than the area of the die 111, in another implementation referring to FIG. 8 and FIG. 9, the protection groove 23 includes a second protection groove 232, of which a cross-sectional area is greater than an area of the heating element 11, so that the second protection groove 232 is configured to accommodate the heating element 11. In other words, compared with the first protection groove that may only accommodate the die on the chip, the second protection groove in this embodiment may be enlarged to accommodate the entire heating element (that is, the chip). In this case, a depth of the second protection groove is greater than a thickness of the heating element. For example, the depth of the second protection groove is a sum of the thickness of the heating element and a thickness of the heat-conductive material. For example, in a case where the thickness of the chip ranges from 580 microns to 690 microns, the depth of the second protection groove may range from 600 microns to 750 microns. In addition, an edge of the second protection groove will be located on the circuit board, so that the heat sink is supported by the circuit board, thereby reducing a force that the chip is subject to.

It should be understood that the shape of the protection groove is not limited to a rectangular shape, but may be consistent with the shape of the die or the chip. In addition, the second surface of the heat sink may be provided with only the first protection groove, or may be provided with only the second protection groove, or may be provided with both the first protection groove and the second protection groove.

In a possible implementation referring to FIG. 5, heat dissipation boss(es) 22 are arranged on the second surface, and an overhead space 25 is formed between adjacent heat dissipation bosses 22, where the protection groove 23 is provided on a surface of the heat dissipation boss(es) 22. The heat dissipation boss(es) 22 are configured to dock with the circuit board 10, so that the overhead space 25 is configured to accommodate components on the circuit board 10.

Figure 10:
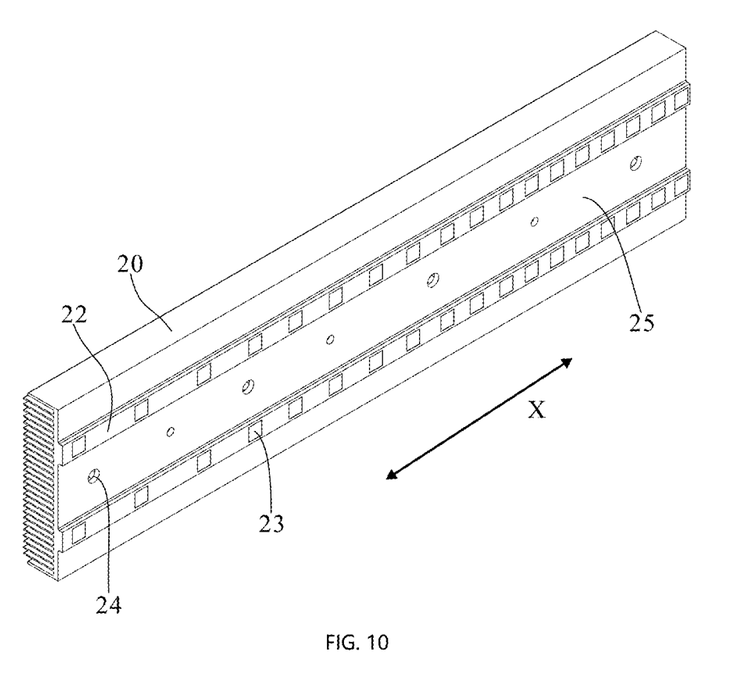
FIG. 10 is a schematic structural diagram in which a heat dissipation boss is provided with a plurality of protection grooves in a first direction according to an embodiment of this application.
Figure 11:
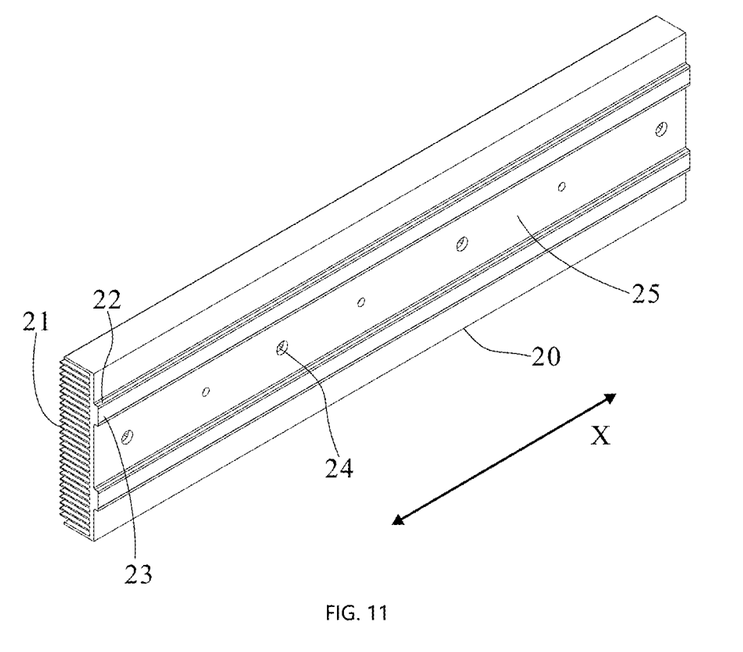
FIG. 11 is a schematic structural diagram in which a heat dissipation boss is provided with an integral protection groove in a first direction according to an embodiment of this application.
Figure 12:
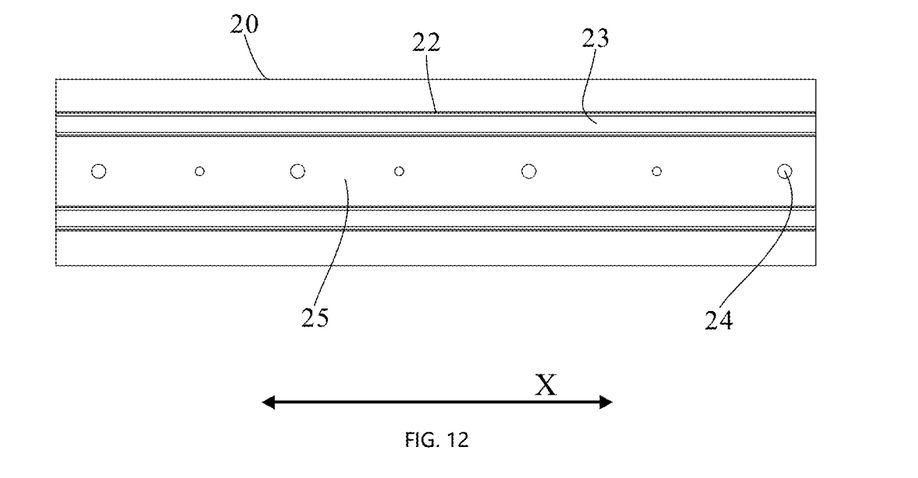
FIG. 12 is a schematic planar structural diagram of FIG. 11.

That is, due to installation of the heat sink and the circuit board, and possibly other components on the circuit board, heat dissipation boss(es) are arranged on the second surface of the heat sink, and an overhead space is formed between adjacent heat dissipation bosses. In this case, for installation with the circuit board 10, a mounting hole 24 may be provided in a region (that is, the overhead space) on the second surface in which no heat dissipation boss is arranged, as shown in FIG. 10 to FIG. 12. Alternatively, components (not shown in the figures) may be arranged in a region of the circuit board corresponding to the overhead space.

That is, a region in which the second surface of the heat sink is configured to be attached to the chip includes the heat dissipation boss(es), and the protection groove as described above is provided at a position of the heat dissipation boss(es) corresponding to the die.

In some embodiments, as shown in FIG. 4, a plurality of heating elements 11 are arranged on the circuit board 10 as a heating element column 12 that extends in a first direction (X), and a plurality of heating element columns 12 are arranged in parallel. As shown in FIG. 10 to FIG. 12, on the second surface, the heat dissipation boss 22 extends in the first direction (X), and a plurality of heat dissipation bosses 22 are arranged in parallel, so that one of the heat dissipation bosses 22 corresponds to one or more heating element columns 12. In other embodiments, the first direction may alternatively be a direction (not shown in the figures) that is perpendicular to the X direction in the second surface.

That is, referring to FIG. 4, the heating elements (such as chips) on the circuit board are usually arranged in an array of horizontal and vertical columns. In other words, a plurality of heating element columns 12 extending in the first direction and parallel to each other are arranged on the circuit board. Each heating element column includes a plurality of heating elements. Referring to FIG. 10 and FIG. 11, on the second surface, the heat dissipation boss also extends in the first direction, and a plurality of heat dissipation bosses are arranged in parallel. In this arrangement, referring to FIG. 6, FIG. 9, and FIG. 10 jointly, one heat dissipation boss may correspond to one heating element column. Or referring to FIG. 7, one heat dissipation boss corresponds to a plurality of heating element columns.

With regard to the protection groove 23, in some embodiments, a plurality of protection grooves 23 are arranged in the first direction (X) on the surface of the heat dissipation boss 22, where the plurality of protection grooves 23 are in one-to-one correspondence with a plurality of dies 111.

That is, referring to FIG. 10, the heat dissipation boss is provided with a plurality of protection grooves in the first direction that corresponds to the plurality of dies in the heating element column, where each of the protection grooves is in one-to-one correspondence with each of the dies. As such, an edge of each of the protection grooves is supported by the plastic seal around a corresponding die, thereby ensuring that a pressure that each plastic seal is subject to is small and thus safety is high.

Alternatively, in some embodiments, the protection groove 23 extends in the first direction (X) on the surface of the heat dissipation boss 22, so that two ends of the protection groove 23 in the first direction (X) at least cover a die column corresponding to the heating element column 12.

That is, referring to FIG. 11 and FIG. 12, in this embodiment, the heat dissipation boss is provided with an integral protection groove in the first direction. The integral protection groove may at least cover the die column corresponding to the heating element column, which is simple to process and easy to implement.

The above content describes the case that the heat dissipation boss 22 is arranged on the second surface of the heat sink, with the surface of the heat dissipation boss 22 being provided with the protection groove 23. Referring to FIG. 8, the second surface may alternatively be a plane, and then the plane is provided with a protection groove. That is, a remaining region of the second surface except for the protection groove is a plane.

In this way, for the size of the protection groove, the plane may be only provided with the first protection groove, or may be only provided with the second protection groove, or may be provided with both the first protection groove and the second protection groove.

In addition, for the shape of the protection groove, the protection grooves on the plane may be arranged in an array of horizontal and vertical columns, or may be arranges as a plurality of integral grooves extending in the first direction.

In a possible implementation, referring to, for example, FIG. 11, the heat dissipation fin 21 extends in the first direction (X), and a plurality of heat dissipation fins are arranged on the first surface in parallel.

In this embodiment, the heat dissipation fins also extend in the first direction, thereby improving the heat dissipation efficiency.

In addition, it may be understood that, referring to FIG. 10, after the heat sink is docked with the circuit board, a heat dissipation direction is the first direction. For example, air is blown toward the heat sink in the first direction, and in this case, because an air inlet and an air outlet at two ends in the first direction are concerned, an interval between adjacent chips in the heating element column may change in a gradual manner. For example, the interval close to the air inlet is smaller, and the interval close to the air outlet is larger. In this case, intervals between a plurality of adjacent protection grooves on the heat dissipation boss shall be consistent with the change as described above.

Figure 13:
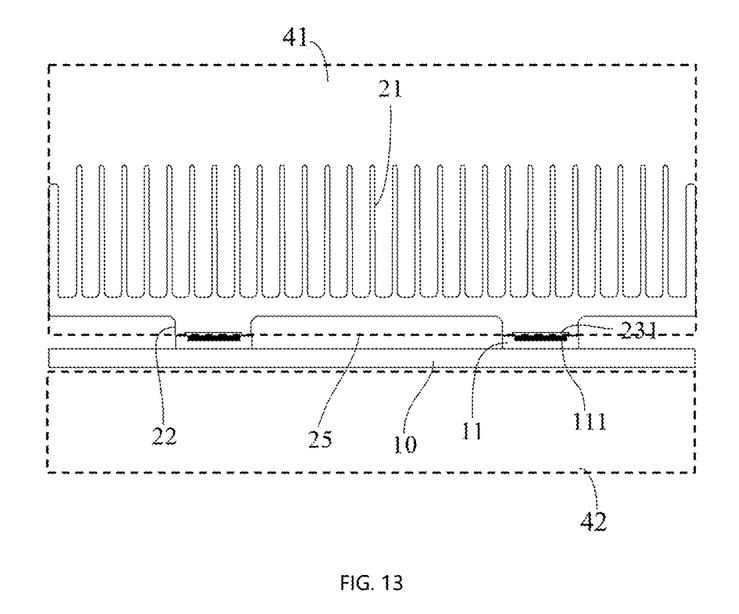
FIG. 13 schematically illustrates a heat dissipation unit according to some embodiments.

Based on the heat sink described above, the embodiments of this application further provide a heat dissipation unit. The heat dissipation unit includes a pair of heat sinks that are respectively arranged on two sides of the circuit board, where at least one of the pair of heat sinks is the heat sink described above. FIG. 13 schematically illustrates a heat dissipation unit according to some embodiments. The heat dissipation unit in this example is otherwise similar to the structure illustrated in FIG. 6, with a heat sink 41 disposed on one side of a circuit board 10. But the head dissipation unit in FIG. 13 includes an additional heat sink 42 disposed on the opposite side of the circuit board 10. The illustration of heat sink 42 is schematic, intended to merely indicate the existence of an additional heat sink but not to indicate any physical attribute, such as shape or size, of the additional heat sink 42.

Based on the heat sink, the embodiments of this application further provide a server. The server includes a circuit board and a heat sink for dissipating heat from the circuit board, where the heat sink is the heat sink described above.

The above content describes fundamental principles of this application with reference to specific embodiments.

However, it should be understood that the advantages, effects, and the like mentioned in this application are merely examples but not limitations. These advantages, effects, and the like cannot be considered to be necessary for the embodiments of this application. In addition, the specific details disclosed above are provided only for illustrative purposes and for convenience of interpretation, rather than limitation. The above details do not limit this application for implementation of the above specific details.

The block diagrams of the device, apparatus, equipment, and system involved in this application are merely illustrative examples and are not intended to require or imply that the device, apparatus, equipment, and system need to be connected, arranged, and configured in the manner shown in the block diagrams. Those skilled in the art realize that the device, apparatus, equipment, and system may be connected, arranged, and configured in any manner. Terms such as "comprise", "include", "have", and the like are open terms that mean "comprising but not limited to" and may be used interchangeably. The terms "or" and "and" used herein refer to the terms "and/or" and may be used interchangeably, unless the context clearly dictates otherwise. The expression "such as" used herein refers to the phrase "such as but not limited to" and may be used interchangeably with "such as but not limited to".

It should further be noted that in the apparatus, device, and method of this application, the components or steps may be decomposed and/or recombined. These decompositions and/or recombinations shall be regarded as equivalent solutions of this application.

The above description of the disclosed aspects is provided to enable any person skilled in the art to implement or use this application. Various modifications to these aspects are obvious to a person skilled in the art, and the general principles defined herein may be applied to other aspects without departing from the scope of this application. Therefore, this application is not intended to be limited to the aspects shown herein but in accordance with the widest scope consistent with the principles and novel features disclosed herein.

The above description is provided for the purposes of illustration and description. In addition, the description is not intended to limit the embodiments of this application to the form disclosed herein. Although a plurality of example aspects and embodiments have been discussed above, a person skilled in the art realize that certain variations, modifications, changes, additions, and sub-combinations thereof shall all fall within the protection scope of the present invention.

What is claimed is:

1. A heat sink configured to dissipate heat from a circuit board, the circuit board being provided with a heating element thereon that comprises a die, the die being located at an end of the heating element away from the circuit board;
   the heat sink comprising:
   a heat sink body, comprising a first surface and a second surface opposite to each other, the first surface being provided with a heat dissipation fin, and the second surface being configured to dock with the circuit board;
   wherein the second surface is configured to be attached to a surface of the circuit board on which the heating element is provided, and the second surface is provided with a protection groove at a position corresponding to the die, with a cross-sectional area of the protection groove at least greater than an area of the die;
   wherein a plurality of heating elements are arranged on the circuit board as a heating element column extending in a first direction, and a plurality of heating element columns are arranged in parallel; and wherein a plurality of heat dissipation bosses are arranged in parallel in the first direction on the second surface, thereby allowing one of the heat dissipation bosses to correspond to one or more of the heating elements.

2. The heat sink according to claim 1, wherein the protection groove comprises at least one of:
- a first protection groove, of which a cross-sectional area is between an area of the heating element and the area of the die; or
- a second protection groove, of which a cross-sectional area is greater than the area of the heating element, allowing the second protection groove to accommodate the heating element.

3. The heat sink according to claim 1, wherein an overhead space is formed between adjacent heat dissipation bosses in the plurality of heat dissipation bosses, and wherein the protection groove is provided on a surface of the heat dissipation bosses, and the heat dissipation bosses are configured to dock with the circuit board, allowing the overhead space to accommodate a component on the circuit board.

4. The heat sink according to claim 1, wherein a plurality of protection grooves are arranged in the first direction on the surface of the heat dissipation boss, wherein the plurality of protection grooves are in one-to-one correspondence with a plurality of dies; or
- the protection groove extends in the first direction on the surface of the heat dissipation boss, to allow two ends of the protection groove in the first direction to cover at least a die column corresponding to the heating element column.

5. The heat sink according to claim 1, wherein a depth of the protection groove is in a range of 50 microns to 100 microns or in a range of 600 microns to 750 microns.

6. The heat sink according to claim 1, wherein the protection groove is filled with a heat-conductive material.

7. A heat dissipation unit, comprising a pair of heat sinks that are respectively arranged on two sides of a circuit board, wherein at least one heat sink of the pair is configured to dissipate heat from the circuit board, the circuit board being provided with a heating element thereon that comprises a die, the die being located at an end of the heating element away from the circuit board;

the heat sink comprising:
a heat sink body, comprising a first surface and a second surface opposite to each other, the first surface being provided with a heat dissipation fin, and the second surface being configured to dock with the circuit board;

wherein the second surface is configured to be attached to a surface of the circuit board on which the heating element is provided, and the second surface is provided with a protection groove at a position corresponding to the die, with a cross-sectional area of the protection groove at least greater than an area of the die;

wherein a plurality of heating elements are arranged on the circuit board as a heating element column extending in a first direction, and a plurality of heating element columns are arranged in parallel; and wherein a plurality of heat dissipation bosses are arranged in parallel in the first direction on the second surface, thereby allowing one of the heat dissipation bosses to correspond to one or more of the heating elements.

8. The heat dissipation unit according to claim 7, wherein the protection groove comprises at least one of:
- a first protection groove, of which a cross-sectional area is between an area of the heating element and the area of the die; or
- a second protection groove, of which a cross-sectional area is greater than the area of the heating element, allowing the second protection groove to accommodate the heating element.

9. The heat dissipation unit according to claim 7, wherein an overhead space is formed between adjacent heat dissipation bosses in the plurality of heat dissipation bosses, and wherein the protection groove is provided on a surface of the heat dissipation bosses, and the heat dissipation bosses are configured to dock with the circuit board, allowing the overhead space to accommodate a component on the circuit board.

10. The heat dissipation unit according to claim 7, wherein a plurality of protection grooves are arranged in the first direction on the surface of the heat dissipation boss, wherein the plurality of protection grooves are in one-to-one correspondence with a plurality of dies; or
- the protection groove extends in the first direction on the surface of the heat dissipation boss, to allow two ends of the protection groove in the first direction to cover at least a die column corresponding to the heating element column.

11. The heat dissipation unit according to claim 7, wherein a depth of the protection groove is in a range of 50 microns to 100 microns or in a range of 600 microns to 750 microns.

12. The heat dissipation unit according to claim 7, wherein the protection groove is filled with a heat-conductive material.

13. A server, comprising a circuit board and a heat sink for dissipating heat from the circuit board, the circuit board being provided with a heating element thereon that comprises a die, the die being located at an end of the heating element away from the circuit board;

the heat sink comprising:
a heat sink body, comprising a first surface and a second surface opposite to each other, the first surface being provided with a heat dissipation fin, and the second surface being configured to dock with the circuit board;

wherein the second surface is configured to be attached to a surface of the circuit board on which the heating element is provided, and the second surface is provided with a protection groove at a position corresponding to the die, with a cross-sectional area of the protection groove at least greater than an area of the die;

wherein a plurality of heating elements are arranged on the circuit board as a heating element column extending in a first direction, and a plurality of heating element columns are arranged in parallel; and wherein a plurality of heat dissipation bosses are arranged in parallel in the first direction on the second surface, thereby allowing one of the heat dissipation bosses to correspond to one or more of the heating elements.

14. The server according to claim 13, wherein the protection groove comprises at least one of:
- a first protection groove, of which a cross-sectional area is between an area of the heating element and the area of the die; or
- a second protection groove, of which a cross-sectional area is greater than the area of the heating element, allowing the second protection groove to accommodate the heating element.

15. The server according to claim 13, wherein an overhead space is formed between adjacent heat dissipation bosses in the plurality of heat dissipation bosses, and wherein the protection groove is provided on a surface of the heat dissipation bosses, and the heat dissipation bosses are configured to dock with the circuit board, allowing the overhead space to accommodate a component on the circuit board.

* * * * *